United States Patent
Iizuka

(10) Patent No.: US 6,326,258 B1
(45) Date of Patent: Dec. 4, 2001

(54) METHOD OF MANUFACTURING SEMICONDUCTOR DEVICE HAVING THIN FILM CAPACITOR

(75) Inventor: Toshihiro Iizuka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/552,884

(22) Filed: Apr. 20, 2000

(30) Foreign Application Priority Data

Apr. 21, 1999 (JP) .................................................. 11-113229

(51) Int. Cl.$^7$ ................................................ H01L 21/8242
(52) U.S. Cl. ........................... 438/239; 438/240; 438/253; 438/398
(58) Field of Search ................................. 438/239, 240, 438/253, 398

(56) References Cited

U.S. PATENT DOCUMENTS 5,716,875 * 2/1998 Jones, Jr. et al. ........................ 438/3
6,156,802 * 12/2000 Cuchiaro et al. ........................ 438/3
6,171,934 * 1/2001 Joshi et al. ........................... 438/469

FOREIGN PATENT DOCUMENTS

954031 * 3/1999 (EP) .

* cited by examiner

Primary Examiner—Trung Dang
(74) Attorney, Agent, or Firm—Sughrue Mion, PLLC

(57) ABSTRACT

A method of manufacturing a semiconductor device such as a semiconductor memory device having a thin film capacitor. The thin film capacitor is formed by sequentially stacking a lower electrode of noble metal, a high dielectric constant insulating film and an upper electrode of noble metal. After forming said capacitor, a first annealing process is performed in an atmosphere including hydrogen and, thereafter, a second annealing process is performed in an atmosphere which does not include hydrogen at a temperature equal to or lower than a temperature of said first annealing process. The first annealing process is performed, for example, in a mixed gas including hydrogen and nitrogen. The second annealing process is performed, for example, in an atmosphere including at least one selected from a group consisting of nitrogen gas, inert gas and oxygen gas.

17 Claims, 5 Drawing Sheets

METHOD OF MANUFACTURING SEMICONDUCTOR DEVICE HAVING THIN FILM CAPACITOR

FIELD OF THE INVENTION

The present invention relates generally to a method of manufacturing a semiconductor device having a high dielectric constant thin film capacitor. More particularly, the present invention relates to a method of manufacturing a semiconductor memory device having a high dielectric constant thin film capacitor in which a leak current characteristic is improved.

BACKGROUND OF THE INVENTION

As a semiconductor memory device becomes highly integrated, an area for forming each capacitor in the semiconductor device becomes small and it becomes difficult to obtain a desired capacitor area. Therefore, recently, a high dielectric constant thin film capacitor is researched in which high dielectric constant material comprising BST, i.e, $Ba_xSr_{1-x}TiO_3(0 \leq x \leq 1)$; PZT, i.e., $PbZr_{1-y}Ti_yO_3(0 \leq y \leq 1)$; and the like is used as a material of a dielectric film, and noble metal is used as upper and lower electrodes.

Here, a description will be made on an example of a conventional method of manufacturing such high dielectric constant thin film capacitor. First, on a silicon substrate in which a MOSFET is fabricated by a known method, an insulating film comprising $SiO_2$ is formed by using a CVD method and the like. Then, a capacitor contact plug comprising polysilicon is formed in the insulating film. A barrier layer made of a stacked structure of TiN/Ti and a lower electrode layer comprising noble metal such as ruthenium (Ru) are formed by using a sputtering method. The barrier layer and the lower electrode layer are then patterned into a desired shape by using RIE (Reactive Ion Etching). Then, a thin film of (Ba, Sr)TiO$_3$ is formed on whole surface of the substrate by using an ECR (Electron Cyclotron Resonance)—MOCVD (Metal Organic Chemical Vapor Deposition) method, at a substrate temperature of 200 degrees Celsius. Thereafter, the (Ba, Sr)TiO$_3$ film is crystallized by an RTA (Rapid Thermal Annealing) process in nitrogen atmosphere. An upper electrode layer comprising noble metal such as Ru and the like is formed and a (Ba, Sr)TiO$_3$ thin film capacitor is obtained. Then, a process for surface protection such as formation of a passivation film and the like is performed by using a known method.

After forming a gate oxide film on a silicon substrate, various process steps are performed to fabricate a transistor. During such various process steps, there is a possibility that structural defects arise between the silicon substrate and the gate oxide film, or that chemical bonds between silicon and oxygen in the gate oxide film are broken. Therefore, there is a possibility that transistor characteristics are deteriorated. In order to recover or improve transistor characteristics, after forming a semiconductor memory device, the semiconductor memory device is usually annealed at a temperature approximately between 300 and 400 degrees Celsius, in an atmosphere of a mixed gas of hydrogen and nitrogen in which a concentration of hydrogen is 3 to 50 percent.

However, the inventor of the present invention has found that, when such annealing process is performed in an atmosphere including hydrogen, local crystallinity is deteriorated at interfaces between the upper electrode and the BST thin film and between the lower electrode and the BST thin film in the capacitor and, thereby, a leak current of the capacitor increases. FIG. 5 shows relationship between voltages applied to capacitors, i.e., upper electrode voltages with respect to lower electrode voltages, and leakage current densities of the capacitors, i.e., densities of leakage current between the upper electrodes and the lower electrodes, when capacitors are annealed, at a temperature of 400 degrees Celsius, in an atmosphere of mixed gases of hydrogen and nitrogen in which concentrations of hydrogen are 5 percent, 20 percent and 50 percent. FIG. 5, also shows relationship designated as "as-fab." between voltages applied to a capacitor and leakage current densities of the capacitor, when the capacitor is not annealed after fabrication. As can be seen from FIG. 5, in case the capacitor is annealed in an atmosphere including hydrogen, the leakage current increases in every hydrogen concentration, when compared with the case the capacitor is not annealed.

SUMMARY OF THE INVENTION

Therefore, it is an object of the present invention to provide a method of manufacturing a semiconductor device having a capacitor in which a leak current characteristic is improved.

It is another object of the present invention to provide a to a method of manufacturing a semiconductor memory device having a high dielectric constant thin film capacitor in which a leak current characteristic is improved It is still another object of the present invention to provide a method of manufacturing a semiconductor memory device having a high dielectric constant thin film capacitor in which a leakage current of the capacitor can be reduced even when the capacitor is annealed in an atmosphere including hydrogen to improve transistor characteristics, after fabricating the capacitor.

It is still another object of the present invention to obviate the disadvantages of the conventional method of manufacturing a semiconductor memory device.

According to an aspect of the present invention, there is provided a method of manufacturing a semiconductor device having a capacitor in which a lower electrode made of noble metal, a high dielectric constant insulating film and an upper electrode made of noble metal are sequentially stacked, the method comprising: after forming the capacitor, performing a first annealing process in an atmosphere including hydrogen; and after performing the first annealing process, performing a second annealing process in an atmosphere which does not include hydrogen at a temperature equal to or lower than a temperature of the first annealing process.

In this case, it is preferable that the semiconductor device is a semiconductor memory device.

It is also preferable that the first annealing process is performed in a mixed gas including hydrogen.

It is further preferable that a hydrogen content in the mixed gas is 3–50 percent.

It is advantageous that the first annealing process is performed in a mixed gas of hydrogen and nitrogen.

It is also advantageous that the second annealing process is performed in an atmosphere including at least one selected from a group consisting of nitrogen gas, inert gas and oxygen gas.

It is further advantageous that the second annealing process is performed in nitrogen gas.

It is preferable that the second annealing process is performed in a vacuum condition.

It is also preferable that the high dielectric constant insulating film comprises a material selected form a group consisting of $Ba_xSr_{1-x}TiO_3(0 \leq x \leq 1)$ and $PbZr_{1-y}Ti_yO_3(0 \leq y \leq 1)$.

It is further preferable that each of the lower electrode and the upper electrode comprises noble metal selected from a group consisting of Ru, Ir and Pt.

It is advantageous that the first and second annealing processes are performed after forming the capacitor and forming aluminum bit wiring conductors.

According to another aspect of the present invention, there is provided a method of manufacturing a. semiconductor device comprising: preparing a silicon substrate; forming at least a gate electrode and source/drain regions on the silicon substrate to form a MOS transistor; forming an interlayer insulating film on the silicon substrate so as to cover the MOS transistor; selectively removing the interlayer insulating film to form an opening; filling the opening with conductive material to form a contact plug; forming a lower electrode layer of noble metal on the interlayer insulating film including the contact plug, the lower electrode layer being electrically coupled with at least one of the source/drain regions via the contact plug; forming a high dielectric constant insulating film on the lower electrode layer; forming an upper electrode layer of noble metal on the high dielectric constant insulating film, the lower electrode layer, the high dielectric constant insulating film and the upper electrode layer constituting a capacitor; after forming the upper electrode layer, performing a first annealing process in an atmosphere including hydrogen; and after performing the first annealing process, performing a second annealing process in an atmosphere which does not include hydrogen at a temperature equal to or lower than a temperature of the first annealing process.

In this case, it is preferable that the semiconductor device is a semiconductor memory device.

It is also preferable that the first annealing process is performed in a mixed gas having a hydrogen content of 3–50 percent.

It is further preferable that the first annealing process is performed in a mixed gas of hydrogen and nitrogen.

It is advantageous that the second annealing process is performed in an atmosphere including at least one selected from a group consisting of nitrogen gas, inert gas and oxygen gas.

It is also advantageous that the second annealing process is performed in a vacuum condition.

It is further advantageous that the high dielectric constant insulating film comprises a material selected form a group consisting of $Ba_xSr_{1-x}TiO_3(0 \leq x \leq 1)$ and $PbZr_{1-y}Ti_yO_3$ $(0 \leq y \leq 1)$.

It is preferable that each of the lower electrode layer and the upper electrode layer comprises noble metal selected from a group consisting of Ru, Ir and Pt.

It is also preferable that the forming a high dielectric constant insulating film on the lower electrode layer comprises: forming a high dielectric constant insulating film on the lower electrode layer; and performing an RTA (Rapid Thermal Annealing) process in nitrogen atmosphere at approximately 700 degrees Celsius to crystallize the high dielectric constant insulating film.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

With reference to the drawings, embodiments of the present invention will now be described in detail.

Figure 1:
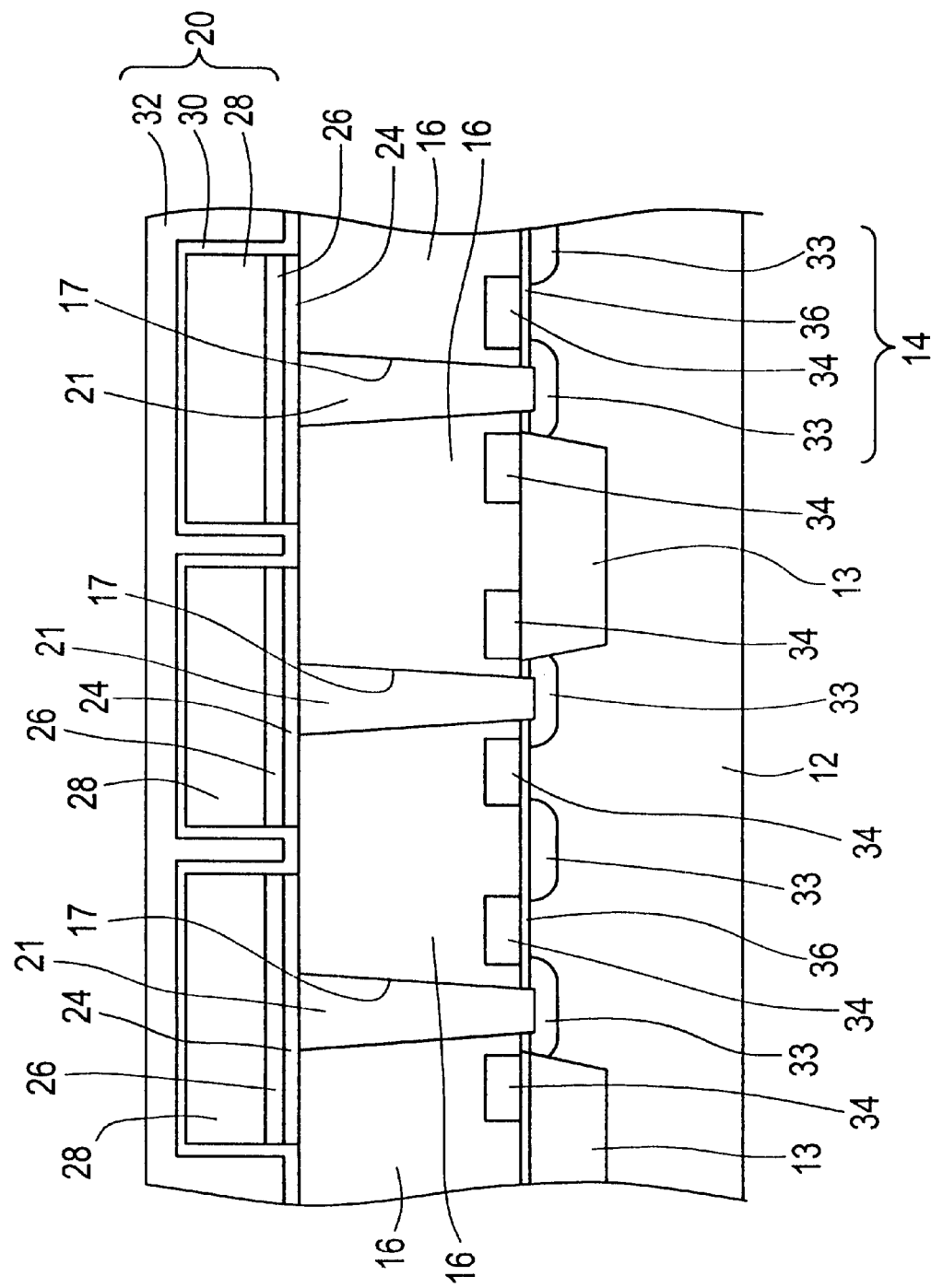
FIG. 1 is a partial cross sectional view showing a structure of a semiconductor memory device which is manufactured by a method according to an embodiment of the present invention.

FIG. 1 is a partial schematic cross sectional view illustrating a structure of a semiconductor memory device manufactured by a method according an embodiment of the present invention. The semiconductor memory device of FIG. 1 is, for example, a DRAM (Dynamic Random Access Memory) device and comprises memory cells each having a capacitor 20 and a MOSFET 14 coupled via a capacitor contact or capacitor contact plug 21. More particularly, the semiconductor memory device of FIG. 1 comprises a p-type silicon substrate 12, the MOSFET 14 disposed in an element forming region of the silicon substrate 12 and isolated from other MOSFET's by element isolation insulating films 13, an interlayer insulating film 16 of, for example, SiO2 film and the like which covers the MOSFET 14, capacitor contact plugs 21 formed within contact holes 17 which penetrate the interlayer insulating film 16, and capacitors 20 disposed on the capacitor contact plugs 21 via a silicon contact layer 24 and a barrier conductor layer 26.

The MOSFET 14 comprises a gate electrode 34 formed on the silicon substrate 12 via a gate oxide film 36 therebetween, and source/drain regions made of n-type diffusion layers 33 formed in the silicon substrate 12 on both side of the gate electrode 34.

The capacitor contact plug 21 is constituted of polysilicon.

The silicon contact layer 24 is formed by using, for example, $TiSi_2$ film, and is provided for decreasing a contact resistance between the capacitor contact plug 21 made of polysilicon and the barrier conductor layer 26.

The barrier conductor layer 26 is provided for preventing silicon and the like from diffusing between metal material constituting the lower electrode 28 and polysilicon constituting the capacitor contact plug 21, and for avoiding production of metal silicide. The barrier conductor layer 26 is formed by using, for example, refractory metal or nitride of the refractory metal such as TiN, WN and the like.

Each of the capacitors 20 comprises a lower capacitor electrode 28, a capacitor insulating film 30 made of a dielectric film and formed on the lower capacitor electrode 28, and an upper capacitor electrode 32 formed on the capacitor insulating film 30. The capacitor insulating film 30 is made of a high dielectric constant film, for example, a (Ba,Sr)TiO$_3$ film, i.e., a BST film, which is a film made of Ba$_x$Sr$_{1-x}$TiO$_3$(0≦x≦1). The upper capacitor electrode 32 and the lower capacitor electrode 28 are made of noble metal, such as Ru, Ir, Pt and the like.

The capacitor 20 is electrically coupled with an n type diffusion layer 33 of the MOSFET 14 via the capacitor contact 21.

With reference to FIGS. 2A through 2D and FIGS. 3A through 3D, a method of manufacturing a semiconductor memory device as an embodiment of the present invention will be described in detail. FIGS. 2A through 2D and FIGS. 3A through 3D show schematic cross sectional structures of workpieces obtained during a process of manufacturing a semiconductor memory device according to the present invention.

Figure 2A:
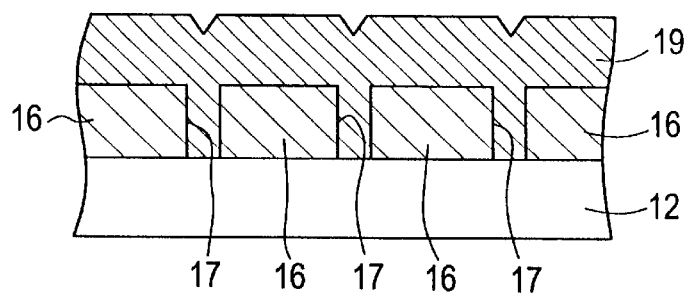
FIGS. 2A through 2D are schematic cross sectional views showing structures of workpieces obtained during a process of manufacturing a semiconductor memory device according to a method as an embodiment of the present invention.

First, by using a known method, a gate oxide film and a gate electrode are formed on a silicon substrate 12 in a region isolated by an element isolation film. Also, by ion implantation and the like which uses the gate electrode as a mask, n type diffusion layers and the like are formed in regions of the silicon substrate 12 on both side of the gate electrode. Thereby, a MOSFET is fabricated, but illustration thereof is omitted in the drawing for the sake of simplicity. Further, as shown in FIG. 2A, by using a known CVD method, an interlayer insulating film 16 which is made of SiO2 and which has a thickness of 300 nm is formed on whole surface of the silicon substrate 12 so as to cover the above-mentioned MOSFET not shown in the drawing. Then, contact holes 17 is opened which penetrate the interlayer insulating film 16 by using photolithography and etching.

Subsequently, a polysilicon layer 19 is deposited on the interlayer insulating film 16 so as to fill the contact holes 17 by using a CVD method. Thereafter, phosphorus (P) is ion implanted into the polysilicon layer 19 to lower resistance of the polysilicon layer 19.

Figure 2B:
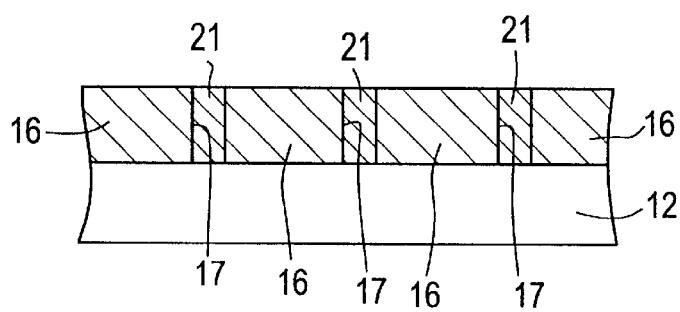

As shown in FIG. 2B, the polysilicon layer 19 is etched back to expose an upper surface of the interlayer insulating film 16. Thereby, polysilicon plugs 21 are formed in the contact holes 17.

Figure 2C:
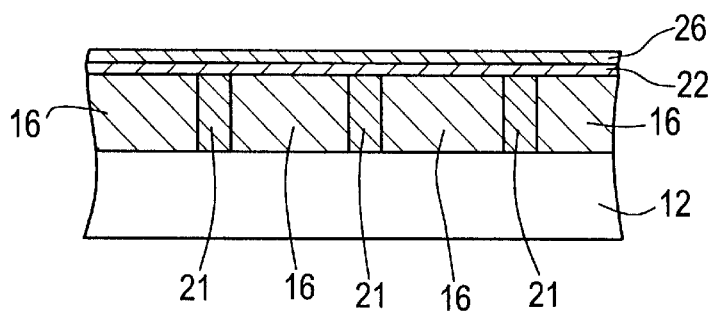

Then, as shown in FIG. 2C, by using a sputtering method and the like, a Ti layer 22 having a thickness of 30 nm and a barrier layer 26 which is made of a TiN layer having a thickness of 50 nmm and which prevents diffusion of silicon and the like are sequentially formed on the interlayer insulating film 16 including on the polysilicon plugs 21.

Figure 2D:
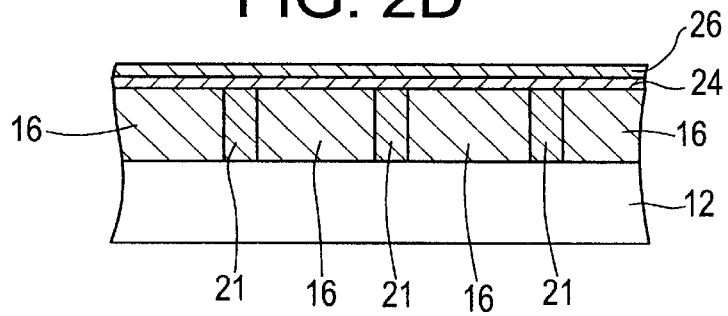

Next, an RTA (Rapid Thermal Annealing) process is performed in nitrogen atmosphere to change the Ti layer 22 to a TiSi layer. Thereby, as shown in FIG. 2D, a silicon contact layer 24 made of a TiSi layer is formed on the interlayer insulating film 16 including on the polysilicon plugs 21.

Figure 3A:
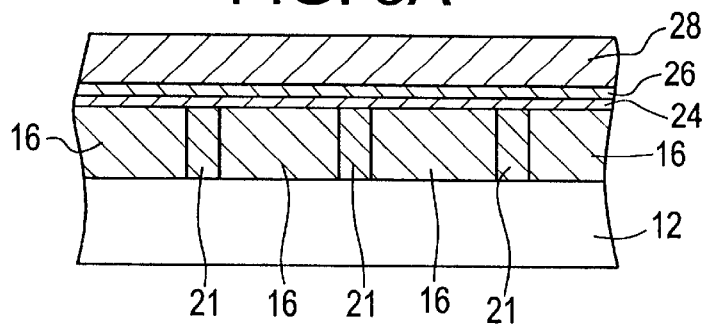
FIGS. 3A through 3D are schematic cross sectional views showing structures of workpieces obtained after the structure shown in FIG. 2D during a process of manufacturing a semiconductor memory device according to a method as an embodiment of the present invention.

As shown in FIG. 3A, a lower capacitor electrode layer 28 which is made of Ru and the like and which has a film thickness of 100 nm is formed on the barrier layer 26, by using a DC sputtering method and the like.

Figure 3B:
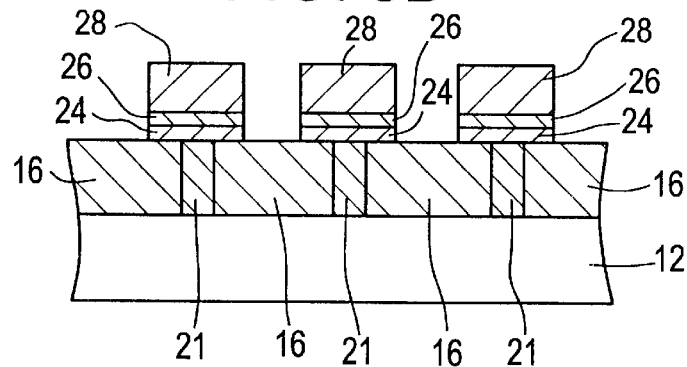
Figure 3C:
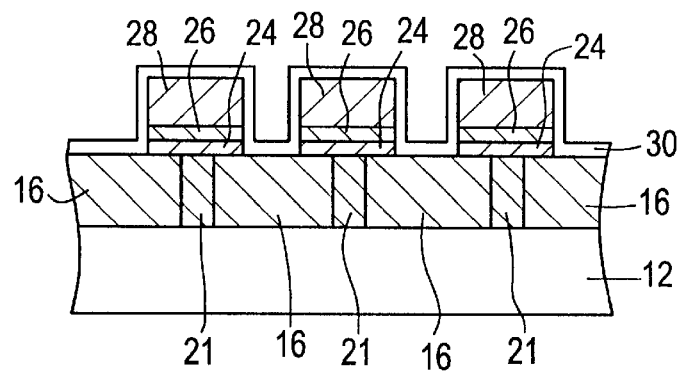

Thereafter, as shown in FIG. 3B, by using a plasma etching method which uses a mixed gas of oxygen and chlorine or by using an RIE (Reactive Ion Etching) method or the like, the lower capacitor electrode 28, the barrier layer 26 and the silicon contact layer 24 are worked or patterned into a desired shape.

Then, by using an ECR (Electron Cyclotron Resonance)—CVD method which uses, as materials, bis-dipivaloylmethanate barium represented by Ba (DPM)$_2$, that is,

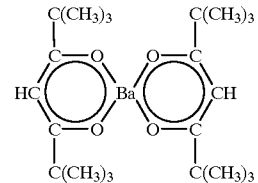

bis-dipivaloylmethanate strontium represented by Sr (DPM)$_2$, that is,

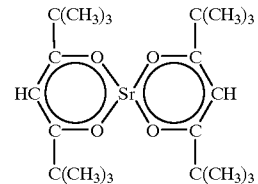

Ti(i-OC$_3$H$_7$)$_4$ and oxygen, a BST film having a thickness of 20 nm as a capacitor insulating film 30 is formed on the interlayer insulating film 16 such that the BST film covers the lower capacitor electrode 28, the barrier layer 26 and the silicon contact layer 24 which are patterned as mentioned above. In this case, a temperature of the substrate is controlled to become, for example, 200 degrees Celsius. Also, if necessary, an RTA (Rapid Thermal Annealing) process is performed in nitrogen atmosphere at 700 degrees Celsius, to crystallize the BST film.

Figure 3D:
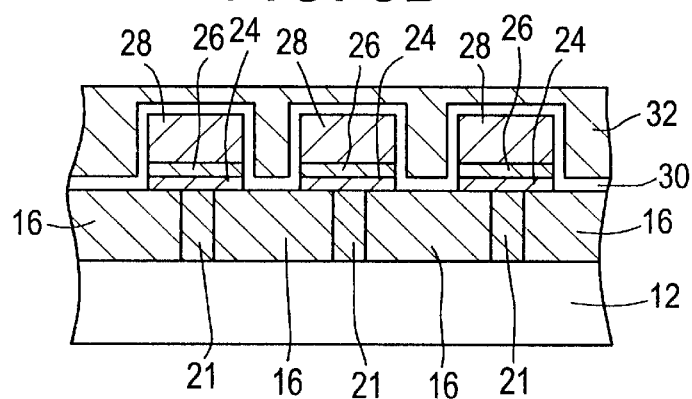

As shown in FIG. 3D, an upper capacitor electrode layer 32 which is made of Ru and the like and which has a thickness of 100 nm is then formed on the BST film 30, by using a DC sputtering method and the like.

Although not shown in the drawing, by using a known process, an interlayer insulating film which is typically made of SiO$_2$ and bit wiring conductors of aluminum are then formed on the upper capacitor electrode layer 32.

Then, in order to hydrogen-terminate dangling bonds of Si at a SiO$_2$/Si interface, that is, at an interface between the gate oxide film and the silicon substrate, a first annealing process is performed in an atmosphere including hydrogen, for example, in a mixed gas of hydrogen and nitrogen in which concentration of hydrogen is 3 to 50 percent. In this case, it is possible to use other gas, for example, inert gas and the like, in place of nitrogen gas. Further, a second annealing process is performed in an atmosphere which does not include hydrogen, for example, in an atmosphere of 100 percent nitrogen, at a temperature equal to or lower than the temperature of the first annealing process. The second annealing process is performed in an atmosphere which does not include hydrogen, that is, in nitrogen atmosphere in this case. However, it is possible to use, in place of or in addition to nitrogen gas, other gas, for example, inert gas, oxygen gas, a mixed gas of these gases, and the like. Also, in case annealing is performed after forming the aluminum bit wiring conductors, it is preferable to use a gas which does not chemically react with aluminum. Further, it is possible to perform the second annealing process in vacuum condition.

Usually, because of a structural defect or break of Si—O bond at an SiO$_2$—Si interface, that is, at an interface between the gate oxide film and the silicon substrate, caused by the manufacturing process of a semiconductor device, characteristics of the MOSFET 14, for example, a leak current characteristic, are deteriorated. Therefore, as the first annealing process mentioned above, a semiconductor device, for example, a semiconductor memory device, obtained is generally annealed in an electric furnace, in an atmosphere comprising a mixed gas, for example, a mixed gas of hydrogen and nitrogen, which includes 3–50 percent hydrogen. By such first annealing process, characteristics of the MOSFET 14 can be improved.

However, the first annealing process performed in the atmosphere including hydrogen, such as the mixed gas of hydrogen and nitrogen, causes a problem of increasing a leakage current of the capacitor 20. In order to solve this problem, in the present invention, the second annealing process is performed in the atmosphere which does not include hydrogen, for example, in nitrogen atmosphere, after the first annealing process, at a temperature which is equal to or lower than the annealing temperature of the first annealing process. By the second annealing process, the leakage current characteristic of the capacitor 20 can be recovered or improved. Here, it should be noted that, since the annealing temperature of the second annealing process is equal to or lower than that of the first annealing process, the characteristics of the MOSFET 14 improved by the first annealing process are not deteriorated by the second annealing process.

In this way, the semiconductor memory device according to the present invention can be fabricated.

Figure 4:
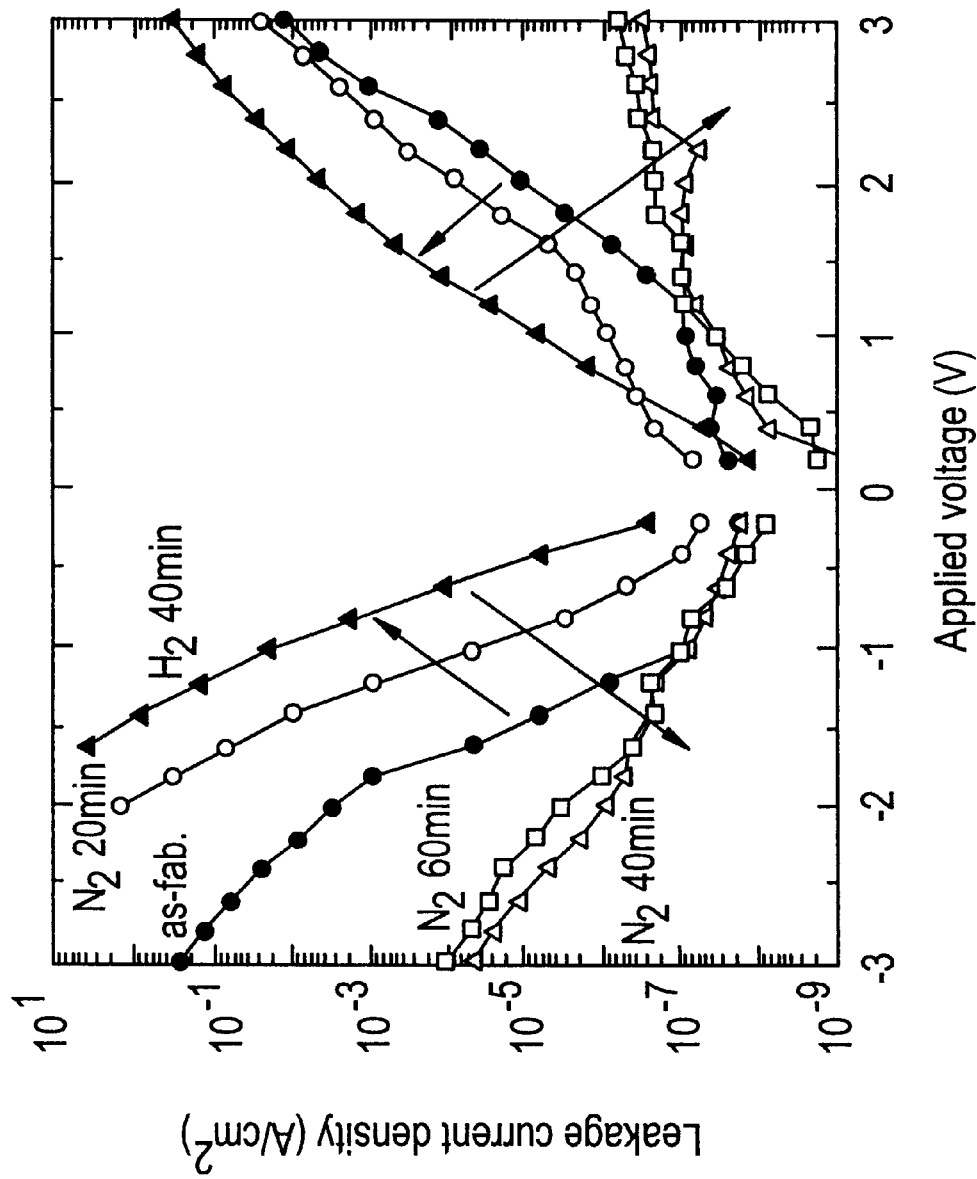
FIG. 4 is a graph showing an effect of reduction of capacitor leakage current when the second annealing process is performed in nitrogen atmosphere after performing the first annealing process in a mixed gas of hydrogen and nitrogen.
Figure 5:
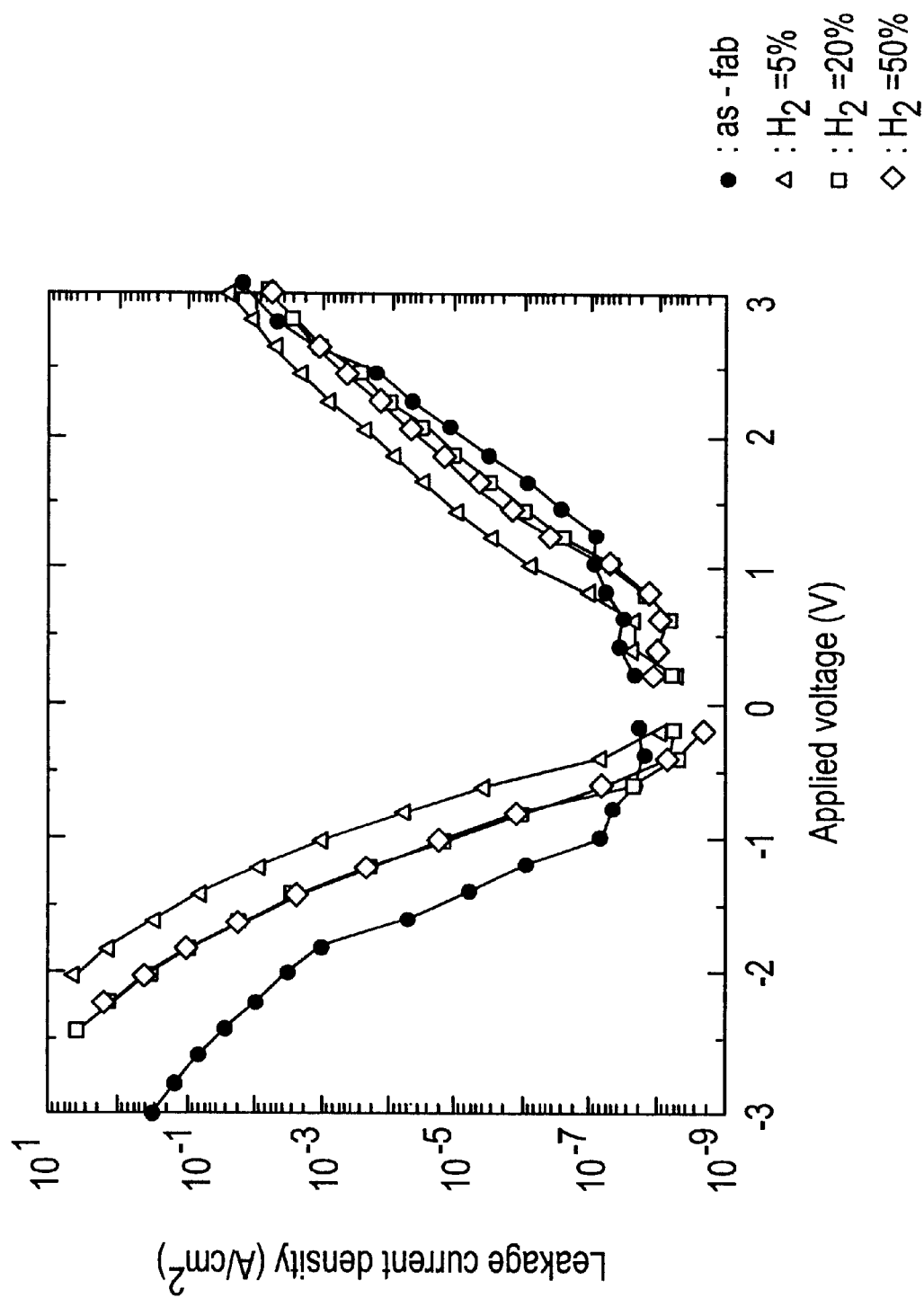
FIG. 5 is a graph showing relationships between voltages applied to capacitors and leakage current density of the capacitors when capacitors are annealed in atmosphere of mixed gases of hydrogen and nitrogen having various concentrations of hydrogen.

FIG. 4 is a graph showing an effect of reduction of capacitor leakage current when the second annealing process is performed in nitrogen atmosphere after performing the first annealing process in a mixed gas of hydrogen and nitrogen. In the graph of FIG. 4, abscissas designate voltages applied to an upper capacitor electrode with respect to voltages of a lower capacitor electrode, and ordinates designate capacitor leakage current densities, i.e., densities of leakage current between the upper capacitor electrode and the lower capacitor electrode. The first annealing in the mixed gas of hydrogen and nitrogen was performed at a temperature of 400 degrees Celsius and at a hydrogen concentration of 5 percent for 40 minutes. The second annealing in nitrogen gas was performed at a temperature of 300 degrees Celsius for 20 minutes (designated as "$N_2$ 20 min" in FIG. 4), 40 minutes (designated as "$N_2$ 40 min" in FIG. 4) and 60 minutes (designated as "$N_2$ 60 min" in FIG. 4). For comparison, FIG. 4 also shows a case in which both the first and second annealing processes were not performed (designated as "as-fab" in FIG. 4), and a case in which the first annealing was performed but the second annealing was not performed (designated as "H2 40 min" in FIG. 4). As can be seen from FIG. 4, the leakage current characteristic of the capacitor deteriorates by the annealing in the mixed gas of hydrogen and nitrogen, but the leakage current characteristic of the capacitor is remarkably improved by performing the nitrogen anneal thereafter.

Although not shown in the drawing, it has become apparent from an experiment by the inventor of the present invention that an effect of improvement of the leakage current characteristic of the capacitor mentioned above is not much sensitive to a pressure of nitrogen atmosphere.

In the embodiment mentioned above, the capacitor insulating film 30 is made of a (Ba, Sr)TiO$_3$ film. However, in the present invention, it is possible to use another high dielectric constant film, for example, a Pb(Zr, Ti)O$_3$ film, that is, a film made of PbZr$_x$Ti$_{1-x}$O$_3$ ($0 \leq x \leq 1$).

Also, in the embodiment mentioned above, the capacitor upper electrode and the capacitor lower electrode are formed by using ruthenium (Ru). However, it is possible to form these electrodes by using other noble metal such as platinum (Pt), iridium (Ir) and the like to obtain the same advantageous effect.

Further, in the embodiment mentioned above, after forming capacitors and thereafter forming aluminum bit wiring conductors, the first annealing process in the mixed gas of hydrogen and nitrogen and the second annealing process in nitrogen gas are performed. However, these annealing processes can be performed after forming the capacitors and before forming the aluminum bit wiring conductors.

Still further, in the embodiment mentioned above, the capacitor is a box-type stacked capacitor in which the lower capacitor electrode has a rectangular shaped profile. However, the capacitor can be any type and can have any structure, as long as the capacitor has a structure in which a high dielectric constant capacitor electrode is interposed between the upper capacitor electrode and the lower capacitor electrode. The present invention can be applied to any type of semiconductor device having such capacitor or capacitors as well as a semiconductor memory device.

The inventor of the present invention has also proposed an annealing process for a BST capacitor which is performed in an atmosphere that does not include hydrogen and which is described in Japanese patent application No. 11-113206. This annealing process is suitable for a case in which a leakage current characteristic of a transistor is sufficiently good and other transistor characteristics are not deteriorated much, that is, for a case in which it is not necessary to improve transistor characteristics by an annealing process in an atmosphere including hydrogen.

On the other hand, according to the present invention, in case the leakage current characteristic of a transistor is not sufficiently good and the like, it is possible at first to improve transistor characteristics by the first annealing process in an atmosphere including hydrogen, and then to improve the capacitor leakage current characteristic which is deteriorated by the first annealing process in the atmosphere including hydrogen, by the second annealing process in an atmosphere which does not include hydrogen. Thereby, both the transistor characteristics and the capacitor characteristics can be compatibly improved. Of course, it is possible to perform the annealing process described in Japanese patent application No. 11-113206 before the first and second annealing processes of this invention, or not to perform such annealing process.

As mentioned above, by an annealing process in an atmosphere including hydrogen, transistor characteristics can be improved but a leakage current characteristic of a high dielectric constant thin film capacitor is deteriorated. However, in the present invention, by using a post-annealing process in an atmosphere which does not include hydrogen, for example, in nitrogen and the like, crystallinity in the vicinity of an interface between a capacitor electrode and a BST film which is deteriorated by the annealing process in the atmosphere including hydrogen can be recovered by causing crystal rearrangement, thereby the capacitor leakage current characteristic can be recovered or improved to a value equal to or better than an initial value. Consequently, according to the present invention, it becomes possible to easily fabricate a semiconductor device which includes at least a transistor and a capacitor having superior electric characteristics.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A method of manufacturing a semiconductor device comprising:
   preparing a silicon substrate;
   forming at least a gate electrode and source/drain regions on said silicon substrate to form a MOS transistor;
   forming an interlayer insulating film on said silicon substrate so as to cover said MOS transistor;
   selectively removing said interlayer insulating film to form an opening;
   filling said opening with conductive material to form a contact plug;
   forming a lower electrode layer of noble metal on said interlayer insulating film including said contact plug, said lower electrode layer being electrically coupled with at least one of said source/drain regions via said contact plug;
   forming a high dielectric constant insulating film on said lower electrode layer;
   forming an upper electrode layer of noble metal on said high dielectric constant insulating film, said lower electrode layer, said high dielectric constant insulating film and said upper electrode layer constituting a capacitor;
   after forming said upper electrode layer, performing a first annealing process in an atmosphere including hydrogen; and
   after performing said first annealing process, performing a second annealing process in an atmosphere which does not include hydrogen at a temperature equal to or lower than a temperature of said first annealing process.

2. A method of manufacturing a semiconductor device as set forth in claim 1, wherein said semiconductor device is a semiconductor memory device.

3. A method of manufacturing a semiconductor device as set forth in claim 1, wherein said first annealing process is performed in a mixed gas having a hydrogen content of 3–50 percent.

4. A method of manufacturing a semiconductor device as set forth in claim 1, wherein said first annealing process is performed in a mixed gas of hydrogen and nitrogen.

5. A method of manufacturing a semiconductor device as set forth in claim 1, wherein said second annealing process is performed in an atmosphere including at least one selected from a group consisting of nitrogen gas, inert gas and oxygen gas.

6. A method of manufacturing a semiconductor device as set forth in claim 1, wherein said second annealing process is performed in a vacuum condition.

7. A method of manufacturing a semiconductor device as set forth in claim 1, wherein said high dielectric constant insulating film comprises a material selected form a group consisting of $Ba_xSr_{1-x}TiO_3$ ($0 \leq x \leq 1$) and $PbZr_{1-y}Ti_yO_3$ ($0 \leq y \leq 1$).

8. A method of manufacturing a semiconductor device as set forth in claim 1, wherein each of said lower electrode layer and said upper electrode layer comprises noble metal selected from a group consisting of Ru, Ir and Pt.

9. A method of manufacturing a semiconductor device as set forth in claim 1, wherein said forming a high dielectric constant insulating film on said lower electrode layer comprises:
   forming a high dielectric constant insulating film on said lower electrode layer; and
   performing an RTA (Rapid Thermal Annealing) process in nitrogen atmosphere at approximately 700 degrees Celsius to crystallize said high dielectric constant insulating film.

10. A method of manufacturing a semiconductor device having a capacitor in which a lower electrode made of noble metal, a high dielectric constant insulating film and an upper electrode made of noble metal are sequentially stacked, said method comprising:
    after forming said capacitor, performing a first annealing process in an atmosphere including hydrogen; and
    after performing said first annealing process, performing a second annealing process in nitrogen gas at a temperature equal to or lower than a temperature of said first annealing process.

11. A method of manufacturing a semiconductor device having a capacitor in which a lower electrode made of noble metal, a high dielectric constant insulating film and an upper electrode made of noble metal are sequentially stacked, said method comprising:
    after forming said capacitor, performing a first annealing process in an atmosphere including hydrogen; and
    after performing said first annealing process, performing a second annealing process in a vacuum condition at a temperature equal to or lower than a temperature of said first annealing process.

12. A method of manufacturing a semiconductor device having a capacitor in which a lower electrode made of noble metal, a high dielectric constant insulating film and an upper electrode made of noble metal are sequentially stacked, said method comprising:
    after forming said capacitor, performing a first annealing process in mixed gas including hydrogen, wherein a hydrogen content in said mixed gas is 3–50 percent; and
    after performing said first annealing process, performing a second annealing process in an atmosphere which does not include hydrogen at a temperature equal to or lower than a temperature of said first annealing process.

13. A method of manufacturing a semiconductor device as set forth in claim 10, wherein said semiconductor device is a semiconductor memory device.

14. A method of manufacturing a semiconductor device as set forth in claim 10, wherein said first annealing process is performed in a mixed gas of hydrogen and nitrogen.

15. A method of manufacturing a semiconductor device as set forth in claim 10, wherein said high dielectric constant insulating film comprises a material selected from a group consisting of $Ba_xSr_{1-x}TiO_3$ ($0 \leq x \leq 1$) and $PbZr_{1-y}Ti_yO_3$ ($0 \leq y \leq 1$).

16. A method of manufacturing a semiconductor device as set forth in claim 10, wherein each of said lower electrode and said upper electrode comprises noble metal selected from a group consisting of Ru, Ir and Pt.

17. A method of manufacturing a semiconductor device as set forth in claim 13, wherein said first and second annealing processes are performed after forming said capacitor and forming aluminum bit wiring conductors.

* * * * *